United States Patent
Lee

(10) Patent No.: US 10,066,321 B2
(45) Date of Patent: Sep. 4, 2018

(54) MONOCRYSTALLINE ZIRCONIA WITHOUT LOW-TEMPERATURE DEGRADATION PROPERTIES AND METHOD FOR GROWING SAME

(71) Applicants: WOOJIN WTP CO., LTD, Gyeongsangbuk-do (KR); Kwang Jong Kim, Daegu (KR)

(72) Inventor: Jae Kun Lee, Gyeonggi-do (KR)

(73) Assignees: WOOJIN WTP CO., LTD, Gyeongsangbuk-Do (KR); Kwang Jong Kim, Daegu (KR)

(*) Notice: Subject to any disclaimer, the term of this patent is extended or adjusted under 35 U.S.C. 154(b) by 0 days.

(21) Appl. No.: 14/772,012

(22) PCT Filed: Jul. 29, 2013

(86) PCT No.: PCT/KR2013/006759
§ 371 (c)(1),
(2) Date: Sep. 1, 2015

(87) PCT Pub. No.: WO2014/163244
PCT Pub. Date: Oct. 9, 2014

(65) Prior Publication Data
US 2016/0010240 A1    Jan. 14, 2016

(30) Foreign Application Priority Data
Apr. 3, 2013  (KR) .................. 10-2013-0036486

(51) Int. Cl.
C30B 11/00 (2006.01)
C30B 29/22 (2006.01)
(Continued)

(52) U.S. Cl.
CPC ............ *C30B 29/16* (2013.01); *C30B 11/003* (2013.01); *C30B 11/005* (2013.01); *C30B 11/14* (2013.01); *C30B 30/00* (2013.01)

(58) Field of Classification Search
CPC ..... C30B 29/16; C30B 11/003; C30B 11/005; C30B 11/14; C30B 30/00
See application file for complete search history.

(56) References Cited

U.S. PATENT DOCUMENTS 5,588,993 A    12/1996  Holder
2010/0298109 A1  11/2010  Takenami et al.

FOREIGN PATENT DOCUMENTS

DE  20-2011-000744  *  6/2011  ......... A61B 17/3211
KR  10-1988-0007808 A     8/1988
(Continued)

OTHER PUBLICATIONS

Machine English Translation of KR2011-0100614 provided by the Espace.net website, internet retrieval date, May 25, 2014, 11 pages.*
(Continued)

*Primary Examiner* — Jonathan C Langman
(74) *Attorney, Agent, or Firm* — The PL Law Group, PLLC

(57) ABSTRACT

Disclosed is a method of growing a zirconia single crystal that has excellent physical properties free from low-temperature degradation and thus enables precise machining, the method including raw material preparation, raw material charging, raw material melting, melt soaking stage, seed production, and single crystal growth.

8 Claims, 13 Drawing Sheets

(51) Int. Cl.
*C30B 30/04* (2006.01)
*C30B 11/14* (2006.01)
*C30B 29/16* (2006.01)
*C30B 30/00* (2006.01)

(56) References Cited

FOREIGN PATENT DOCUMENTS

| KR | 10-2001-0064655 A | 7/2001 | | |
|----|-------------------|--------|---|---|
| KR | 10-2003-0079333 A | 10/2003 | | |
| KR | 10-2011-0100614 A | 9/2011 | | |
| KR | 20110100614 A | * | 9/2011 | ............. C01G 25/02 |

OTHER PUBLICATIONS

Machine English translation of Golsen Ltd. (DE 20-2011-000744) provided by the Espace website, internet retrieval date of Nov. 15, 2017.*
International Search Report for PCT/KR2013/006759.
Christensen et al., "Crystal growth and characterization of advanced material", La Habana, Cuba, Nov. 30-Dec. 10, 1987.
Office action dated Mar. 9, 2018 from US Patent Office in a counterpart U.S. Appl. No. 15/419,020 (all the cited references are listed in this IDS.).

* cited by examiner

MONOCRYSTALLINE ZIRCONIA WITHOUT LOW-TEMPERATURE DEGRADATION PROPERTIES AND METHOD FOR GROWING SAME

TECHNICAL FIELD

The present invention relates to a method of growing a zirconia single crystal, and more particularly to a method of growing a zirconia single crystal that has excellent physical properties free from low-temperature degradation, thus enabling precise machining.

BACKGROUND ART 3 mol % yttria ($Y_2O_3$)-stabilized zirconia (tetragonal zirconia polycrystal, which is hereinafter referred to as "3Y-TZP"), manufactured by a sintering process, is known to have excellent physical properties including hardness, flexural strength, fracture toughness, etc., but suffers from severe degradation properties, in which the strength of the sintered zirconia is drastically decreased due to microcracking therein, when the sintered zirconia is allowed to stand at a low temperature of about 200° C. in a humid atmosphere for several hours. Such degradation properties are referred to as low-temperature degradation, the causes of which have not yet been clearly determined, and are merely based on hypotheses put forth by Yoshimura, Lange, Weinnubst, Burggraal, Azzoni, Kruse, and Simon Lawson. With the goal of solving low-temperature degradation problems, methods of adding a small amount of material such as Mn, Ge or Ce or further fining grains of zirconia, serving as a main ingredient, have been introduced through a number of experiments. However, these methods have served only to slightly increase resistance to low-temperature degradation, and thus fundamental solutions are still required. Korean Patent Publication Application No. 10-2001-0041132 discloses a method of preventing the appearance of low-temperature degradation in zirconia-containing material.

3Y-TZP, which was published on Nature by Dr. Garvie, 1975, has been applied to human artificial joint surgery in Europe since the 1980s depending on only the superior physical properties without knowing low-temperature degradation thereof. However, there have occurred serious medical emergencies due to 3Y-TZP. Specifically, significant defects, including the breaking of operated joints because of the reduced strength attributable to the low-temperature degradation of 3Y-TZP, have occurred, and thus the use of sintered zirconia (3Y-TZP) in human bodies was banned by the FDA (USA) in 2001, and reoperation of already-operated artificial joints using titanium metal was ordered.

DISCLOSURE

Technical Problem

Accordingly, the present invention has been made keeping in mind the above problems encountered in the related art, and an object of the present invention is to provide a zirconia single crystal that has high hardness, high flexural strength and high fracture toughness and thus enables precise machining, free from low-temperature degradation, and to provide a method of growing the same.

Technical Solution

In order to accomplish the above object, the present invention provides a zirconia single crystal free from low-temperature degradation, manufactured from a raw material comprising 95 to 93 wt % of $ZrO_2$, 5 to 7 wt % of $Y_2O_3$, and inevitable impurities and grown by a skull melting process using a high-frequency induction heating device, wherein a raw material seed having a size of 10 to 30 µm is selected from the raw material to produce a seed for growing the zirconia single crystal, and the raw material, which is melted, is subjected to soaking, in which an output power of the high-frequency induction heating device is maintained constant for at least 5 hr, and an induction coil of the high-frequency induction heating device is elevated at an elevation rate of 2 mm/hr or less to produce the seed.

In addition, the present invention provides a method of growing a zirconia single crystal, comprising: (a) preparing a mixture of $ZrO_2$ and $Y_2O_3$ as a raw material for growing the zirconia single crystal; (b) charging the raw material and a melting seed in a skull crucible for growing the zirconia single crystal using a high-frequency induction heating device; (c) supplying power to the high-frequency induction heating device to melt the raw material charged in the skull crucible; (d) maintaining an output power of the high-frequency induction heating device at a predetermined output power for a predetermined period of time in order to soak the melted raw material; (e) elevating an induction coil of the high-frequency induction heating device at a first elevation rate, thus producing a seed; (f) elevating the induction coil of the high-frequency induction heating device at a second elevation rate, thus growing a single crystal; and (g) cutting off power to the high-frequency induction heating device when completing growth of the zirconia single crystal in the skull crucible, and cooling the zirconia single crystal grown in the skull crucible while allowing the zirconia single crystal to stand in the skull crucible.

In addition, the present invention provides a zirconia single crystal grown by the method as above.

Advantageous Effects

According to the present invention, a zirconia single crystal has no low-temperature degradation, and can thus be utilized in materials for human bodies, such as dental materials or artificial joints.

In an embodiment of the present invention, the color of the zirconia single crystal is not completely transparent, but is translucent and milky. Hence, when this zirconia is employed as a dental material, a superior esthetic appearance can result.

MODE FOR INVENTION

Figure 1:
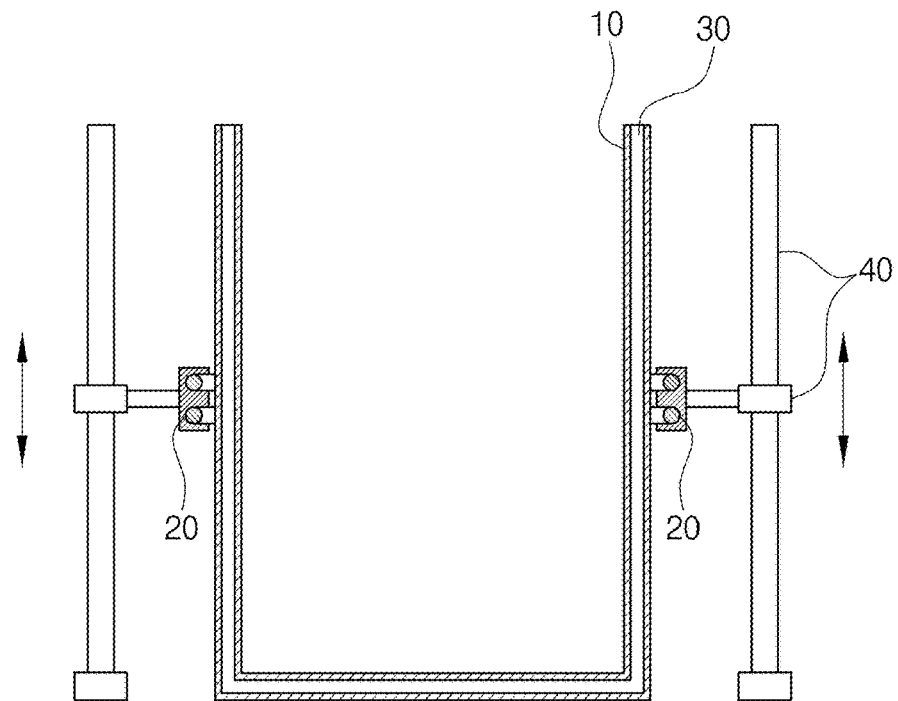
FIG. 1 is a cross-sectional view schematically illustrating a skull melting apparatus for use in growing a zirconia single crystal according to an embodiment of the present invention.

Hereinafter, a detailed description will be given of preferred embodiments of the present invention with reference to the appended drawings. Throughout the drawings, the same reference numerals are used to designate the same or similar elements. Further, in the description of the present invention, if it is determined that the detailed description of the related known technology would obscure the gist of the present invention, the description thereof will be omitted.

Before the description of a method of growing a zirconia single crystal, the skull melting apparatus for use in growing a zirconia single crystal according to the present invention is described below.

FIG. 1 is a cross-sectional view schematically illustrating a skull melting apparatus for use in growing a zirconia single crystal according to an embodiment of the present invention.

As illustrated in FIG. 1, the skull melting apparatus for use in growing a zirconia single crystal comprises a skull crucible having an internal accommodation space, a high-frequency induction heating device including an induction coil and a high-frequency oscillator so that a raw material charged in the skull crucible is inductively heated at high frequency, an elevation unit for elevating the induction coil in up and down directions of the skull crucible, and a cooling unit for cooling the skull crucible.

The skull crucible is provided in the form of a cylindrical cup having an internal accommodation space in which the raw material is placed. To grow a single crystal having a uniform structure, the use of a skull crucible having a relatively large diameter is favorable. In the case where a small skull crucible is used, a melting line is not uniformly formed due to the temperature difference between the center of the skull crucible and the periphery thereof, making it impossible to obtain a desired crystal structure. Thus, in order to ensure a crystal having the predetermined shape required in the present invention, the diameter of the skull crucible is preferably set in the range of 20 to 50 cm. If the diameter of the skull crucible is less than 20 cm, it is difficult to form the melting line due to the temperature difference between the periphery of the skull crucible and the center thereof. In contrast, if the diameter thereof exceeds 50 cm, the period of time required to cool the grown crystal may increase, and furthermore, the properties of the crystal grown in the center of the skull crucible may differ from those of the crystal grown in the periphery of the skull crucible. The size of the skull crucible is not limited thereto, and any skull crucible having various sizes may be used depending on the need of user.

The induction coil is provided in the form of a ring around the outer surface of the skull crucible. The induction coil is connected to the high-frequency oscillator, and the high-frequency oscillator generates high-frequency current and then applies this current to the induction coil. When the high-frequency oscillator operates, the induction coil forms a high-frequency electromagnetic field inside the skull crucible, whereby the raw material in the skull crucible is directly inductively heated. The raw material in the skull crucible undergoes high-frequency induction heating by the high-frequency electromagnetic field formed by the induction coil, and is then melted. The oscillation frequency for generating a high-frequency magnetic field may vary depending on the capacity of the skull crucible, the components of the raw material, etc., but preferably falls in the range of 10 kHz to 1 MHz.

The cooling unit is provided to the outer bottom and wall of the skull crucible to cool the skull crucible and the zirconia single crystal grown in the skull crucible. The cooling unit may be provided in the form of a cooling water pipe that comes into contact with the outer surface of the skull crucible. When the skull crucible is cooled by the cooling unit, it is possible to prevent damage to the skull crucible attributable to high temperatures when melting the raw material in the skull crucible by heating the inside of the skull crucible by the induction coil.

The elevation unit enables the induction coil to be elevated in up and down directions of the skull crucible. This serves to change the height of the induction coil relative to the raw material charged in the skull crucible.

Meanwhile, although the induction coil is formed so as to be elevated in up and down directions of the skull crucible in the present embodiment, the apparatus may be configured such that the induction coil is fixed and the skull crucible is elevated. The structure of the apparatus is not limited, as long as the induction coil may be moved up and down relative to the skull crucible.

Below is a description of a method of growing a zirconia single crystal according to an embodiment of the present invention using the aforementioned skull melting apparatus.

Figure 2:
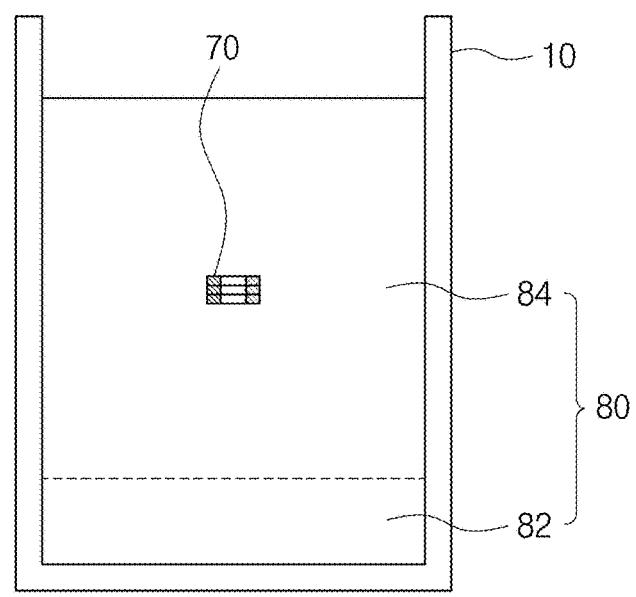
FIG. 2 is a cross-sectional view illustrating a raw material and a melting seed, which are charged in the skull crucible of FIG. 1.

FIG. 2 is a cross-sectional view illustrating a raw material and a melting seed, which are charged in the skull crucible of FIG. 1, and FIGS. 3 to 5 sequentially illustrate raw material melting, seed production, and crystal growth in the skull crucible.

According to an embodiment of the present invention, the zirconia single crystal is grown by a skull melting process at high frequency. In an embodiment of the present invention, the method of growing a zirconia single crystal comprises: preparing a raw material for growing a zirconia single crystal; charging the raw material in a skull crucible and locating a melting seed in the raw material; supplying power to a high-frequency induction device to melt the raw material; maintaining sufficient soaking time to form a complete melting line; elevating a high-frequency induction coil, thus producing a seed; elevating the high-frequency induction coil (work coil) at a high elevation rate compared to when producing the seed, thus growing the crystal; cutting off power to the high-frequency induction heating device when growth of the zirconia single crystal in the skull crucible is completed; and cooling the grown zirconia single crystal. The individual steps of the method are specified below.

Preparing Raw Material for Growing Zirconia Single Crystal

As the raw material for growing a zirconia single crystal, a total of 40 kg of a mixture comprising 37.44 kg of 99.9% $ZrO_2$ powder, made by KCM, Japan, and 2.56 kg of 99.9% $Y_2O_3$ powder, made by Kojundo, Japan, is prepared. Furthermore, the raw material may contain inevitable impurities. To ensure a uniform mixture of the $ZrO_2$ powder and the $Y_2O_3$ powder, wet mixing for 20 hr using zirconia balls and ethanol and then drying in an oven are carried out.

Figure 5:
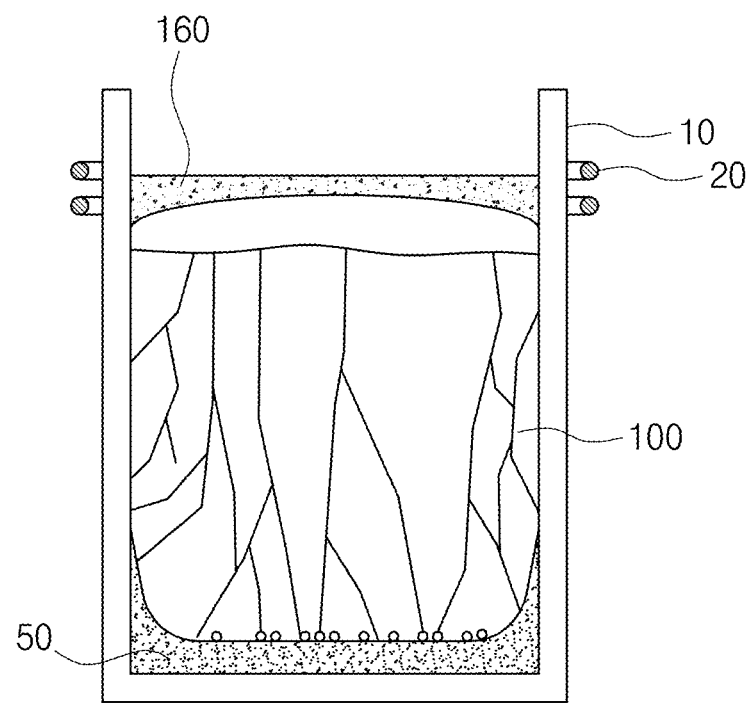

In the course of preparing the raw material, a raw material for a seed is separately prepared. Below, the raw material for a seed is referred to as a "raw material seed" to distinguish it from the aforementioned raw material. One of the major features of the present invention is that a seed necessary for initial crystal growth is uniformly formed from the raw material and then slowly grown into a crystal, compared to a typically known skull melting process. Specifically, the raw material charged in the skull crucible is melted, after which a melting line 60 (FIG. 3) is formed for a sufficient soaking time, and a seed 90 (FIG. 4), which is the uniform crystal seed formed from the raw material layer having a controlled grain size, is grown, yielding a crystal 100 (FIG. 5).

More specifically, to realize a complete and uniform seed, the grain size distribution of the raw material introduced at the position where the seed is produced is very important. Zirconia powder useful as the raw material preferably has a particle size ranging from 1 to 100 μm. In particular, the raw material seed preferably has a uniform size ranging from 10 to 30 μm. When the raw material seed is introduced at the position where the melting line is formed, a uniform seed may result.

Hence, the raw material seed having a grain size distribution in the range of 10 to 30 μm is separately prepared to form the uniform seed. As such, $ZrO_2$ and $Y_2O_3$ having the above grain size distribution range may be obtained using a #325 sieve. Thereby, 5 kg of the raw material seed comprising 4.68 kg of $ZrO_2$ and 0.32 kg of $Y_2O_3$ mixed together is prepared. The raw material seed may be provided in the form of a uniform mixture through wet mixing and then drying.

In the present embodiment, the composition ratio of $ZrO_2$ and $Y_2O_3$ of the raw material is 93.6:6.4 wt %. For comparison, zirconia crystal growth testing was performed at different composition ratios of the raw material while the other conditions were maintained the same as above. Based on the test results, when the composition ratio of $ZrO_2$ and $Y_2O_3$ was set to 96:4 wt %, the produced crystal was a polycrystal rather than a single crystal. Also, when the composition ratio of $ZrO_2$ and $Y_2O_3$ was set to 92:8 wt %, the color of the produced crystal was quite transparent compared to the present embodiment, and a large number of cracks occurred, undesirably resulting in poor physical properties. Hence, the composition ratio of $ZrO_2$ and $Y_2O_3$ of the raw material preferably falls in the range of 95:5 wt % to 93:7 wt %.

Charging Raw Material and Melting Seed 5 kg of the raw material seed is first charged in the skull crucible. As such, the height of the raw material seed charged in the skull crucible is about 4 cm. The raw material seed is introduced to the position for forming a melting line upon charging the raw material. The height of the raw material seed charged in the skull crucible is preferably set in the range of 5 to 40 mm from the bottom of the skull crucible.

The raw material for growing a zirconia single crystal is charged on the raw material seed. As such, a melting seed is located in the raw material. The melting seed is preferably located at the center of the raw material charged in the skull crucible. To this end, the raw material and the melting seed may be charged in such a manner that 15 kg of the raw material is placed on the raw material seed, the melting seed is situated, and then 20 kg of the raw material is further placed. Among 40 kg of the raw material, 5 kg of the remaining raw material is prepared for feeding. In the course of melting the raw material in the skull crucible, a crust layer 160 (FIG. 5) in a solid phase is formed at the uppermost position of the raw material, thus preventing the heat of the resulting melt from being emitted outside. In some situations, a hole may be formed in the crust layer, thus allowing heat to escape from the melt. When the hole is formed in the crust layer in this way, it may be blocked by the raw material for feeding in order to prevent the heat of the melt from being emitted outside.

With regard to the melting seed, zirconia and yttria, which constitutes the raw material, have high electric resistance in a powder phase at room temperature, and thus do not undergo high-frequency induction heating. However, as the temperature increases, electric resistance may drastically decrease, thus facilitating the high-frequency induction heating. Hence, a small amount of melting seed, such as zirconia metal or a carbon ring, is situated in the charged raw material to function as kindling. When the temperature begins to increase through induction heating of the melting seed, heating occurs from the raw material near the melting seed, and electric resistance may drastically decrease with an increase in the temperature of the raw material, thus widening the melting range, and ultimately the raw material charged in the skull crucible is thoroughly heated and melted. In the present embodiment, the melting seed includes three carbon rings having an outer diameter of 8 cm, an inner diameter of 6 cm, and a thickness of 3 cm.

Melting Raw Material

Figure 3:
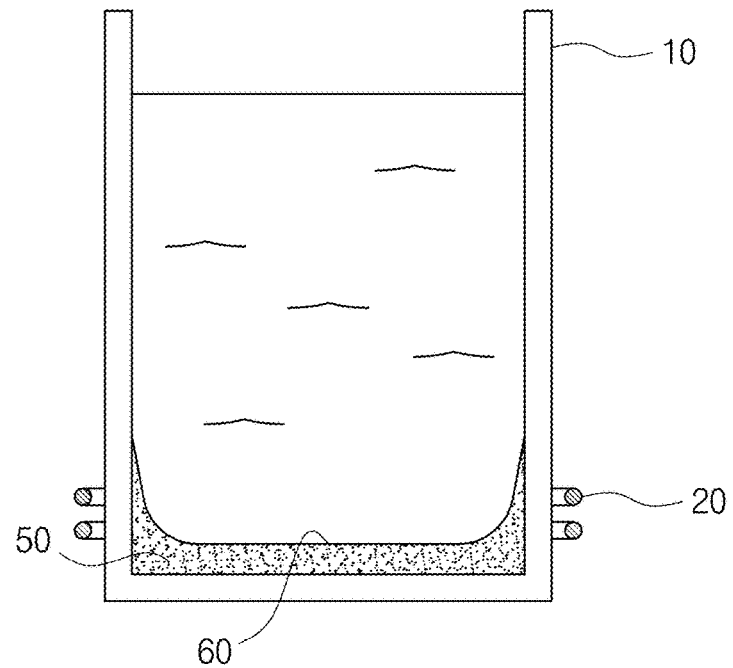
FIGS. 3 to 5 sequentially illustrate procedures for, in the skull crucible, raw material melting, seed production, and crystal growth.
Figure 4:
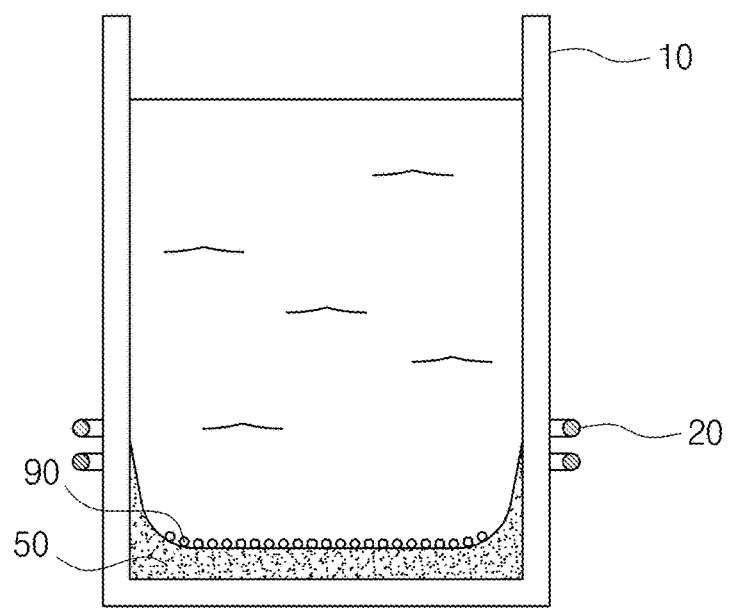
Figure 6A:
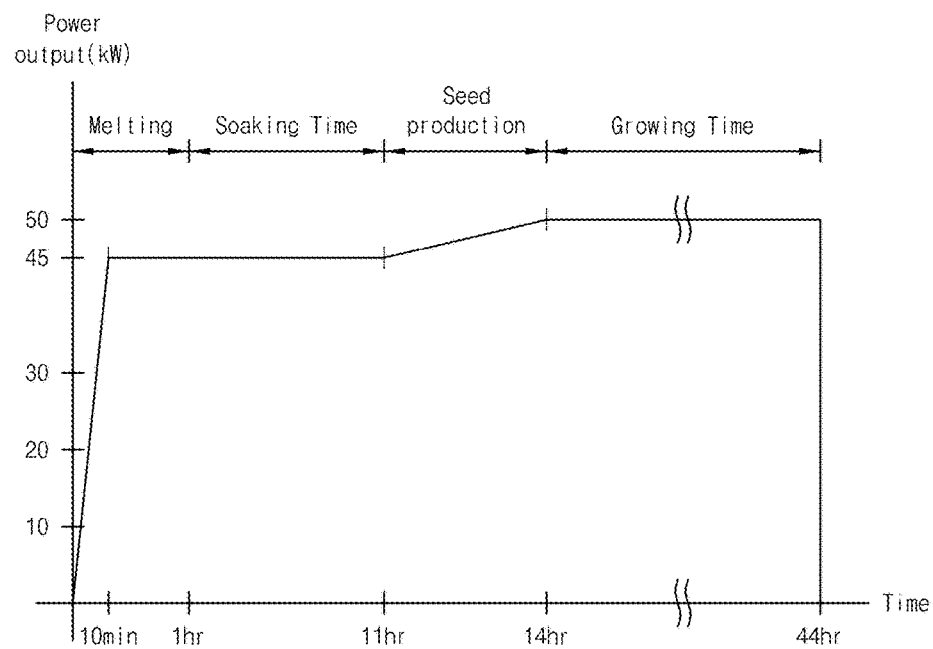
FIGS. 6a and 6b are graphs illustrating the output power of a high-frequency induction heating device and the height of an induction coil depending on the growth time of the zirconia single crystal according to an embodiment of the present invention.
Figure 6B:
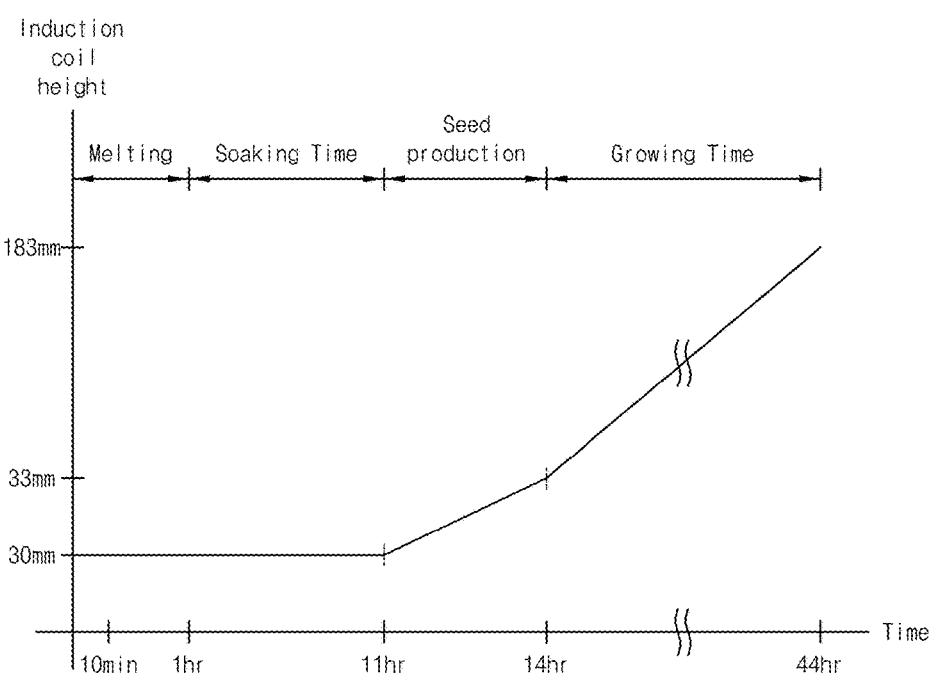

As illustrated in FIGS. 3, 6a and 6b, power begins to be supplied at the position where the induction coil is elevated by 30 mm from the bottom of the skull crucible. The starting height of the induction coil is the same as the height of the sintered layer, which will be described later.

The output power of the high-frequency induction heating device for raw material melting is 45 kW. As such, the output power may be gradually increased for 10 min, rather than being instantly generated to 45 kW. When the output power of the high-frequency induction heating device reaches 45 kW, it is maintained for 50 min so that the raw material is melted. The output power of the high-frequency induction heating device for raw material melting may vary depending on the amount of raw material that is charged and the size of the skull crucible. When a high-frequency magnetic field is applied to the skull crucible by the induction coil, a hot melted lump is formed. The raw material near the hot melted lump begins to be melted while the electric resistance thereof is greatly lowered by the hot melted lump, so that the melting range gradually widens.

As such, the raw material in contact with the inner wall of the skull crucible, especially the raw material in contact with the bottom of the skull crucible, is not melted, but is sintered due to the high temperature of the melted raw material, thus forming a sintered layer having a thickness ranging from ones of mm to tens of mm. In the present embodiment, the sintered layer is formed 20 mm thick. This sintered layer functions as a refractory material that prevents heat from being emitted downwards. Therefore, the melt on the sintered layer is blocked from the outside by the sintered layer and the crucible, thereby preventing pollution attributable to the entry of external impurities. The raw material inside the sintered layer is continuously melted, and almost all of the raw material other than the sintered layer is melted, and may thus result in the state shown in FIG. 3.

Soaking of the Melted Lump

After the raw material is completely melted, the melted lump is subjected to soaking. Soaking of the melted lump is a process for forming a more complete melting line, unlike a conventional method of growing a zirconia single crystal.

During the soaking step, high-frequency power is maintained constant for a predetermined period of time. In the soaking step, the magnitude of the power supplied to the induction coil is preferably the same as that of the power supplied to the induction coil in the raw material melting step. In the present embodiment, to soaking of the melted raw material, high-frequency power is fixed to 45 kW for a soaking time of 10 hr. The soaking time and the high-frequency power supplied for the soaking time may vary depending on the amount of the raw material, the size of the skull crucible, etc. Nevertheless, the soaking time is preferably set to at least 5 hr.

Starting to Produce the Seed

As for a typical single crystal forming method, a seed is prepared outside and is then introduced into a crystal growth furnace. In contrast, the method of manufacturing a zirconia single crystal according to the present invention using a Czochralski process includes directly producing a seed at the bottom of the introduced raw material, and then growing a crystal from the seed. In this method, the properties of the crystal may differ depending on the shape of the produced seed, and thus the production of the uniform seed is regarded as important in determining the shape of the crystal. In the present invention, the shape of the produced seed is precisely controlled depending on need, thereby achieving the uniform seed shape necessary for the present invention.

Figure 13:
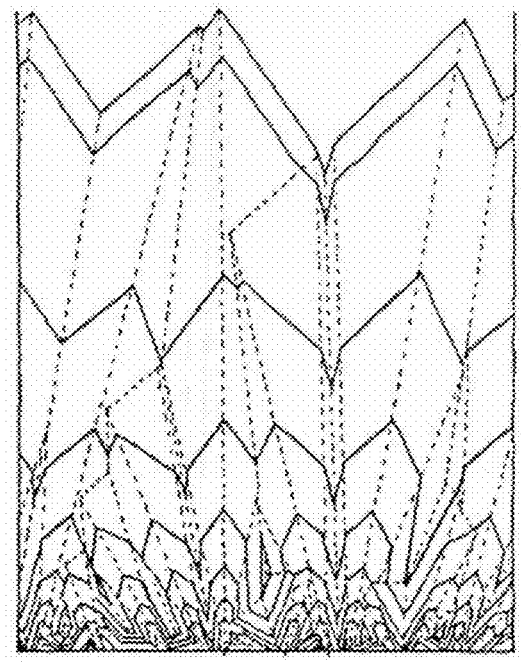
FIG. 13 illustrates the correlation between seed production and crystal growth direction in the process of growing a zirconia single crystal according to the embodiment of the present invention.

After completion of the soaking step, the induction coil is elevated at a predetermined elevation rate for a predetermined period of time to form the seed, and the output power of the high-frequency induction heating device is gradually increased. FIG. 13 illustrates the correlation between the seed production and the crystal growth from the seed. The seed is produced from the sintered layer formed at the bottom of the skull crucible, and the melt in the skull crucible begins to be grown in the form of a single crystal from the seed. Among microcrystal grains growing toward the melt when the seed is produced, the crystal is continuously grown when the fastest growth direction is perpendicular to the growth interface, and the growth of the remainder is stopped. Hence, the production of the uniform seed is important in terms of determining the crystal shape. In the course of producing the seed, the elevation rate of the induction coil is preferably controlled to 2 mm/hr or less, and the seed production time is preferably set to 1 hr or more.

In the present embodiment, as illustrated in FIGS. 6a and 6b, the induction coil is elevated by a total of 3 mm for 3 hr at an elevation rate of 1 mm/hr during the seed production. As such, the output power of the high-frequency induction heating device is gradually increased from 45 kW to 50 kW.

Growing the Crystal

After completion of the seed production, the induction coil is elevated at a rate higher than the elevation rate of the induction coil in the seed production step, thereby growing the crystal. As the induction coil is elevated relative to the skull crucible, a zirconia single crystal is gradually grown upwards from the lower portion of the skull crucible. When the induction coil is elevated and reaches the uppermost position of the skull crucible, the operation of the high-frequency induction heating device is stopped.

The elevation rate of the induction coil affects the rate of growth of the crystal and thus determines the shape of the grown crystal. If the elevation rate of the induction coil is excessively high, the resulting crystal is thin and may become non-uniform with many vertical crystal folds. In contrast, if the elevation rate of the induction coil is excessively low, waved-horizontal crystal folds appear, making it impossible to obtain a high-quality crystal. Hence, the elevation rate of the induction coil is preferably maintained in the range of 1 to 20 mm/hr. In the present embodiment, the elevation rate of the induction coil upon growing the crystal is set to 5.0 mm/hr.

Cooling Process

The single crystal grown in the skull crucible is isolated from its surroundings by the skull crucible and is slowly cooled while keeping it warm. In the cooling process, the grown single crystal is preferably cooled at a predetermined cooling rate by means of a cooling unit. As such, the cooling rate preferably falls in the range of 70 to 110° C./hr. When the cooling process is performed at such a cooling rate, the cooling time is set to about 48 hr in the present embodiment.

The physical properties of the single crystal thus grown include a hardness of 1,250 Hv and a specific gravity of 6.15 g/cm$^3$. Furthermore, fracture toughness, which is the physical property associated with chip generation, which is used to determine whether precise machining may be carried out upon mechanical processing, is 12.5 MPa$\sqrt{m}$ in the zirconia single crystal according to the present invention, which is approximately double that of 6.7 MPa$\sqrt{m}$ of the world's best Kyocera product.

The measured value thereof and the calculation procedure are as follows.

Fracture toughness testing was performed by KS L 1600 (Testing methods for fracture toughness of high performance ceramics), wherein SEPF, which was originally intended to be used, caused irregular cracks, including divaricated cracks, upon pre-cracking, and thus an IF process was applied instead.

Upon measurement, the indentation load P was 10 N, the crack length was an average of 63.2 μm based on the measured values of 58.7, 72.1, 69.7, 52.1, and 63.2 μm, and the average elastic modulus was 203.3 GPa. The fracture toughness (Kc) is calculated by the following equation:

$$Kc = 0.018\left(\frac{E}{HV}\right)^{\frac{1}{2}}\left(\frac{P}{C^{\frac{3}{2}}}\right) = \frac{0.023\left(E^{\frac{1}{2}}P^{\frac{1}{2}}a\right)}{C^{\frac{3}{2}}}$$

wherein
Elastic modulus (E): 203.3 GPa
Vickers hardness (Hv): 1250
Indentation load (P): 10 N
Half of crack length (C): 31.6 μm
Half of average indented diagonal length (a): 61.525 μm.

When these values are substituted into the equation, the fracture toughness Kc is calculated to be 12.5 MPa√m.

Also, flexural strength indicates the ability of a sample to resist deformation under pressure. The zirconia single crystal according to the present invention has a flexural strength of 170.6 Kgf/mm², which is higher than 100 Kgf/mm² of the Kyocera product.

Based on the results of several tests, the zirconia single crystal according to the present invention exhibited a hardness of 1,200 to 1,300 Hv, a fracture toughness of 11.5 to 14.5 MPa√m, a flexural strength of 160 to 180 Kgf/mm², and a specific gravity of 6.10 to 6.15 g/cm³. Therefore, the zirconia single crystal according to the present invention manifests fracture toughness and flexural strength that are extremely higher than those of cubic zirconia, and possesses superior physical properties that approximately double those of 3Y-TZP, the world's best Kyocera product, made in Japan.

Meanwhile, in Examples 2 and 3, single crystal growth was conducted under conditions of different composition ratios and processing times. The conditions and the results are given in Table 1 below.

TABLE 1

Figure 10:
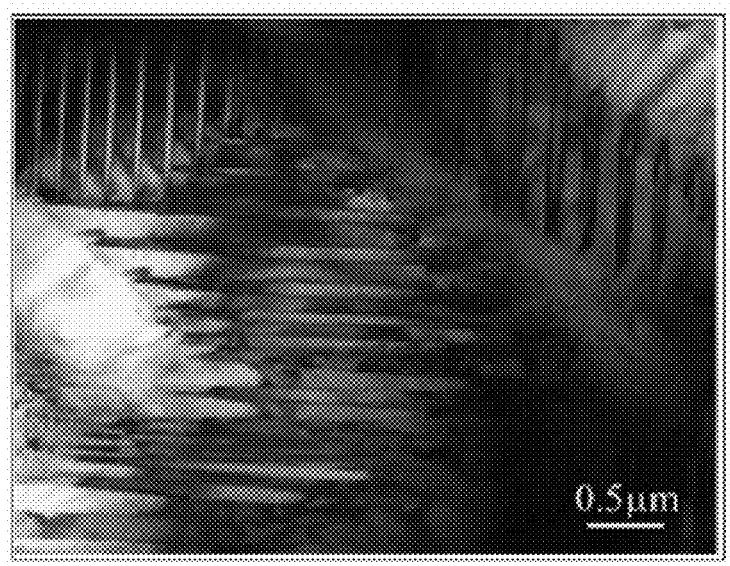
FIG. 10 is a transmission electron microscope (TEM) bright-field image of the zirconia single crystal according to the embodiment of the present invention.
Figure 15:
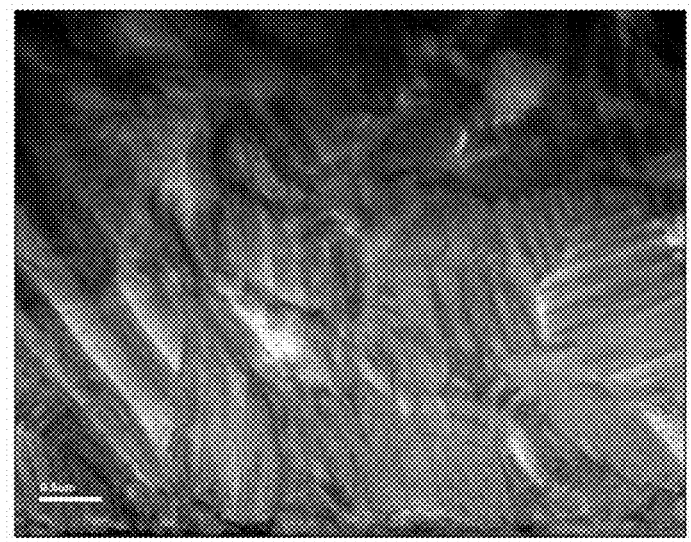
FIG. 15 is a TEM image illustrating a single crystal produced by a single crystal growth process according to another embodiment of the present invention.
Figure 16:
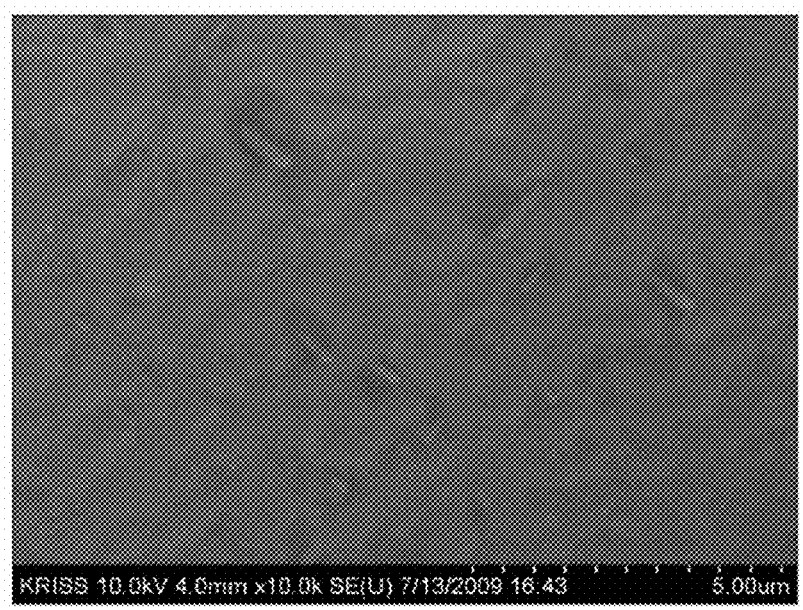
FIG. 16 is an SEM image illustrating a single crystal produced by a single crystal growth process according to still another embodiment of the present invention.

|  |  | Ex. 1 | Ex. 2 | Ex. 3 |
|---|---|---|---|---|
| Raw material | ZrO₂ | 93.6 wt % | 95 wt % | 94 wt % |
|  | Y₂O₃ | 6.4 wt % | 5 wt % | 6 wt % |
| Melting time (hr) |  | 1 hr | 1 hr | 3 hr |
| Soaking time (hr) |  | 10 hr | 5 hr | — |
| Seed production time (hr) |  | 3 hr | 1 hr | — |
| growing time (hr) |  | 30 hr | 30 hr | 50 hr |
| low-temperature degradation |  | No | No | Yes |
| Crystal image |  | FIG. 10 | FIG. 15 | FIG. 16 |

In Example 2, the raw material was composed of 95 wt % of ZrO₂ and 5 wt % of Y₂O₃, the melting time was the same as in Example 1, and the soaking time and the seed production time were short compared to Example 1. Based on the test results, the grown zirconia single crystal did not exhibit low-temperature degradation. FIG. 15 illustrates a TEM image of the single crystal of Example 2, produced by a single crystal growth process according to another embodiment of the present invention. Referring to FIG. 15, the herringbone structure can be seen to be irregular due to insufficient soaking time, unlike FIG. 10.

In Example 3, the soaking step and the seed production step were not performed, unlike Examples 1 and 2. The resulting grown single crystal showed low-temperature degradation. FIG. 16 illustrates an SEM image of the single crystal of Example 3, produced by a single crystal growth process according to still another embodiment of the present invention.

Figure 14:
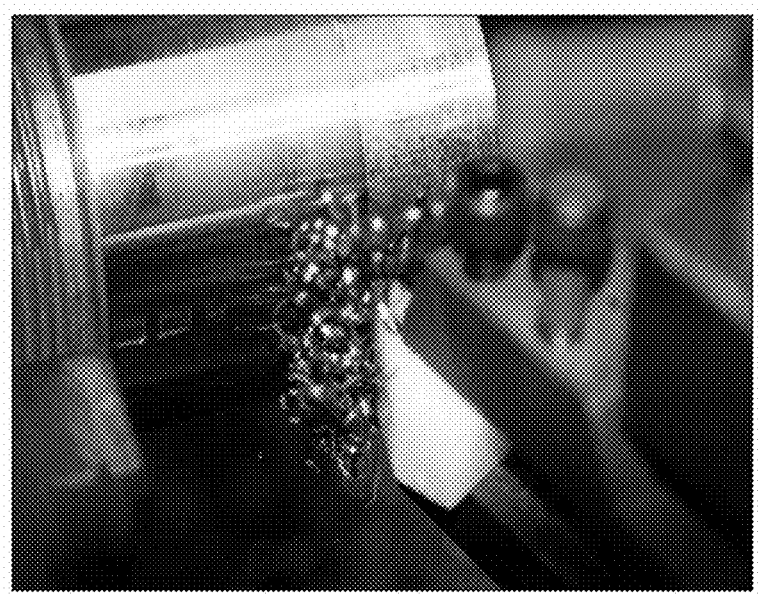
FIG. 14 is an image illustrating the cutting of an iron workpiece using a lathe cutting tool made of the zirconia single crystal according to the present invention.

FIG. 14 illustrates lathe processing of an iron workpiece using a lathe cutting tool made of the zirconia single crystal according to the present invention.

Furthermore, the zirconia single crystal (hereinafter referred to as "t'-YSZ") according to the present invention, having the above superior physical properties, is free from low-temperature degradation, as is apparent from the following test results. To analyze the low-temperature degradation, a single crystal sample was cut to a coin shape (outer diameter: 25 mm, thickness: 3 mm), and both sides thereof were subjected to mirror-surface grinding. For comparison, a commercially available 3 mol % yttria-stabilized zirconia material for use in sintering, made by Tosoh, Japan, was prepared, subjected to cold isostatic pressing (CIP) at a pressure of 40,000 psi, and then thermally treated at 1,400° C. for 2 hr, so that the resulting sintered zirconia (3Y-TZP) was manufactured into a sample having the same size as in the single crystal sample according to the present invention. These two kinds of samples were treated in an autoclave in a humid atmosphere at 200° C. (1.55 MPa) for 24 hr and then measured for comparison. This is a very cruel condition corresponding to at least 60 years (simulated) of aging time for in-vivo conditions. Based on the test results, 3Y-TZP was confirmed to exhibit low-temperature degradation because the strength was drastically decreased to 281±31 MPa from 1,227±312 MPa after autoclave treatment, whereas t'-YSZ, which is the zirconia single crystal according to the present invention, did not show low-temperature degradation because the strength was 1,328±537 MPa before autoclave treatment and 1,345±251 MPa after autoclave treatment.

The reason why the low-temperature degradation is caused is known to be as follows: when moisture is diffused into the grains of sintered zirconia polycrystal (3Y-TZP), the grains are removed from the surface of the polycrystal due to volume expansion caused by phase transition from a tetragonal phase into a monoclinic phase by the formation of "Y(OH)₃", and after removal of the grains, cracking and then fracture gradually progress over time, ultimately incurring low-temperature degradation.

The zirconia single crystal according to the present invention has a t'-phase crystal structure. The t'-phase indicates the base unit lattice present in a t'-YSZ crystal, and the lattice present in the t'-YSZ crystal is typically tetragonal, but has a small size corresponding to half of the size of general ZrO₂, and has a crystal structure close to a cubic structure. Hence, this t'-phase is referred to as a pseudocubic phase. The reason is that its crystal structure is almost the same as the cubic structure. More specifically, the tetragonality ratio c/a of t'-phase falls in the range of 1.013 to 1.02. The width a and the height c of the crystal are almost the same as each other.

As known in the art, cubic zirconia having a fully cubic structure (a=c) does not exhibit low-temperature degradation. Therefore, as the tetragonality ratio is close to 1, that is, as the crystal structure of the zirconia single crystal is close to a cubic structure, low-temperature degradation is prevented. However, since cubic zirconia having a fully cubic phase has poor physical properties (flexural strength and fracture toughness), many cracks and chips may be generated upon mechanical processing, making it impossible to perform precise machining. However, the zirconia single crystal according to the present invention is advantageous because no low-temperature degradation is exhibited, but the physical properties that enable precise machining are realized.

The reason why the zirconia single crystal according to the present invention has no low-temperature degradation has not been ascertained, but is assumed to be based on the following.

First, the zirconia single crystal according to the present invention has a t'-phase crystal microstructure, which is a twinned structure with a herringbone shape. In the present invention, when stress due to partial phase transformation is applied to the structure of t'-YSZ, the twinned herringbone structure thereof is considered to absorb the energy of stress without fracturing. Specifically, even when the tetragonal phase of t'-YSZ is partially transformed into a monoclinic phase due to moisture absorption, the surrounding twinned structure and herringbone structure may absorb the applied stress (energy) while moving like springs, and thus low-temperature degradation is not exhibited.

Figure 7A:
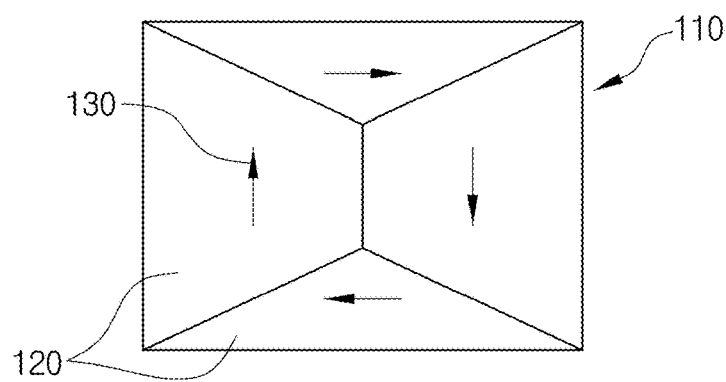
FIGS. 7a to 7c illustrate the transformation of residual stress due to stress that is spontaneously present in the crystal and external stress, FIG. 7a showing the ferroelasticity, FIG. 7b showing the application of external stress when in the state of FIG. 7a, and FIG. 7c showing the residual stress transformed due to ferroelastic switching by external stress.
Figure 7B:
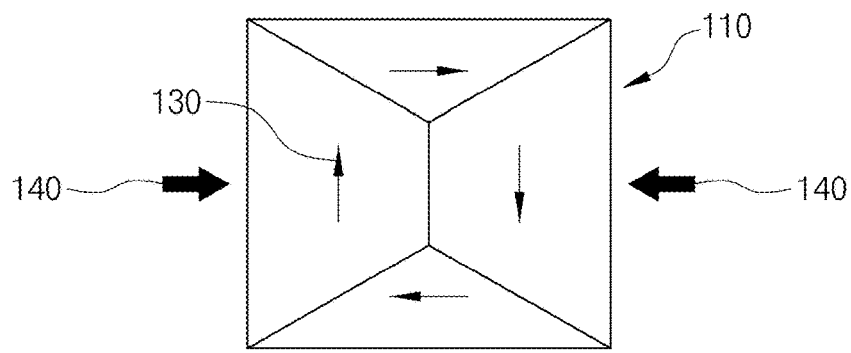
Figure 7C:
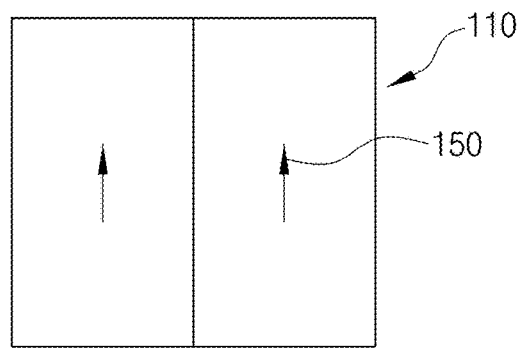

With reference to FIGS. 7a to 7c, in the herringbone structure, stress 130 is spontaneously generated in the domain 120, regardless of external changes, and is arranged in domain form, which is referred to as ferroelasticity as illustrated in FIG. 7a. The reason why low-temperature degradation is generated is considered to be that the crystal structure of sintered zirconia is broken due to stress caused by phase transformation from the tetragonal phase into a monoclinic phase. In contrast, in the zirconia single crystal according to the present invention, when external stress 140 generated by phase transformation is applied to the domain, the internal stress 130 of the domain 120 is transformed into stress 150, as shown in FIG. 7c, by the external stress 140, and the external stress 140 applied to the domain 120 is naturally absorbed. This procedure is referred to as ferroelastic switching, and thereby t'-YSZ is regarded as preventing low-temperature degradation.

Second, t'-YSZ according to the present invention is a single crystal, and thus has a significantly different structure from sintered zirconia polycrystal (3Y-TZR), which has round interfaces. Hence, since there is no likelihood of causing cracking due to removal of the grains, low-temperature degradation does not appear.

Third, because of the tetragonality close to 1 and the slightly different c-axis length of the crystal near the herringbone structure, the applied stress is removed, and thus physical properties of the crystal may become stronger.

Figure 8:
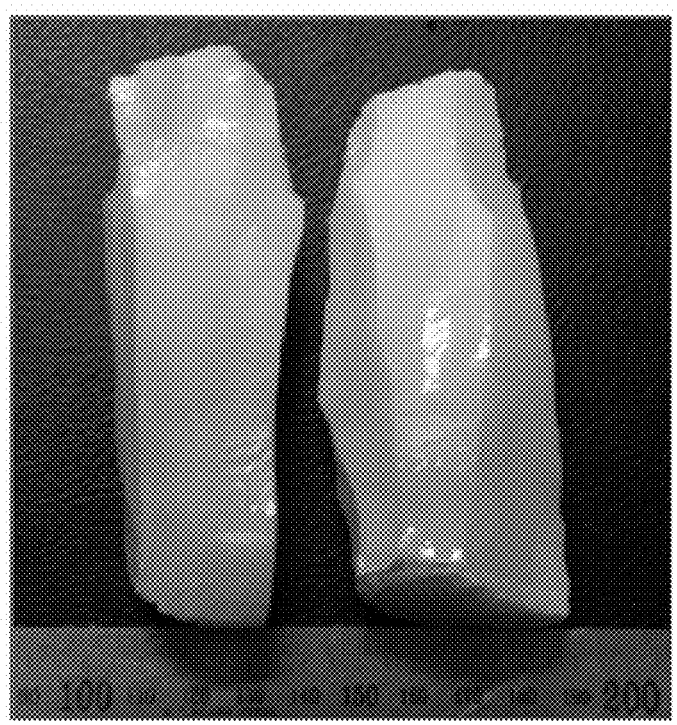
FIG. 8 is an image illustrating a zirconia single crystal grown by a process of growing a zirconia single crystal according to an embodiment of the present invention.

FIG. 8 illustrates a 3.2 mol % yttria-stabilized zirconia single crystal (t'-YSZ) grown by the process of growing a zirconia single crystal according to an embodiment of the present invention, wherein the height thereof is 10 cm and the thickness thereof is 2 to 4 cm. The color of this single crystal is translucent and milky, indicating that something that reflects light is inferred to be present inside the crystal. This appears due to light diffraction at the domain boundary formed by the twinned tetragonal structure.

The grown zirconia single crystal according to the present invention was observed using SEM (JEOL, JSM6701F), and using TEM with a 200 KV (Tecnai G2 F20S-TWIN) field emission gun.

Figure 9:
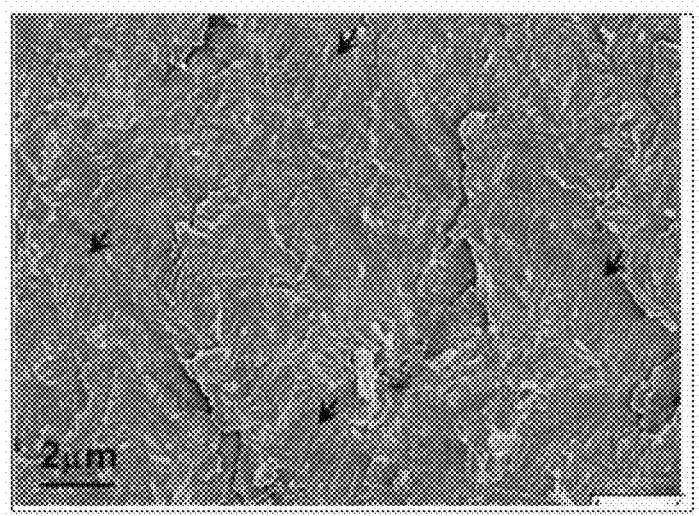
FIG. 9 is a scanning electron microscope (SEM) image illustrating the fracture surface of the zirconia single crystal according to the embodiment of the present invention.

FIG. 9 is an SEM image illustrating the microstructure of the fracture surface of the zirconia single crystal (t'-YSZ) according to the present invention. As is apparent from the herringbone shape and the stripe pattern (as represented by the arrows), this t'-phase shows a polydomain structure. This domain has a thin needle shape having a width of about hundreds of nm and a length of about 1 to 2 μm, and the domain boundary has a thickness of 15 to 20 μm (FIG. 10). This twinned structure has a combined herringbone shape with an orthogonal array, as shown in FIGS. 9 and 10.

FIG. 10 illustrates a TEM bright-field image of the zirconia single crystal (t'-phase), wherein bright and dark longitudinal domains are regularly arranged. For this reason, these domains are expressed as the twinned herringbone domain structure mentioned above.

The ferroelastic domain switching, which appears in the herringbone domain deformation process, is different from martensitic transformation, in which a tetragonal phase is transformed into a monoclinic phase. This arises from symmetry-lowering ferroic phase transition (e.g. reorientation of the ferroelastic domain), without changes in the crystal structure. The reason why the t'-phase material does not exhibit low-temperature degradation is considered to result from such a ferroelastic domain structure. This ferroelastic transformation is well known to be a kind of toughening mechanism.

Figure 11A:
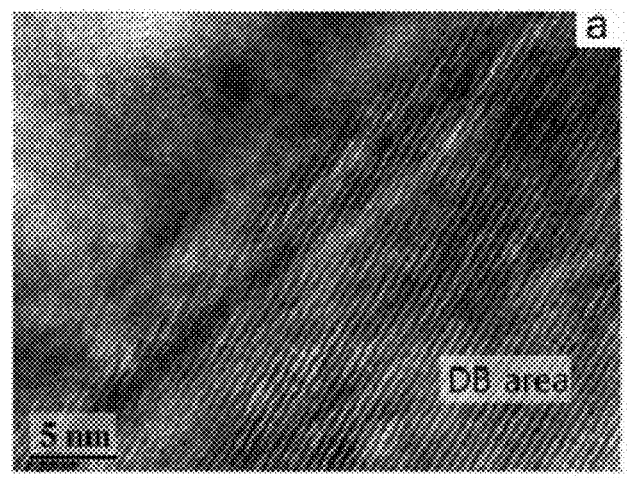
FIGS. 11a to 11c are images illustrating the domain boundaries of the zirconia single crystal according to the embodiment of the present invention.
Figure 11B:
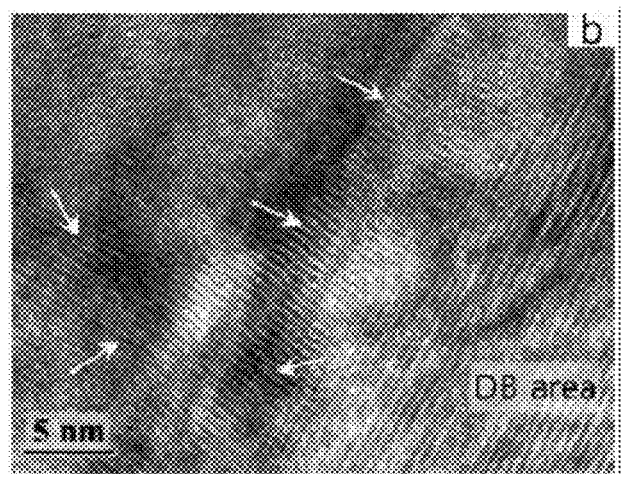
Figure 11C:
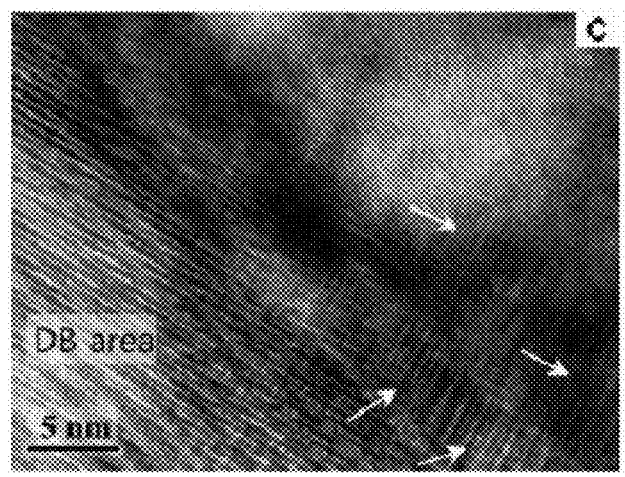
Figure 11D:
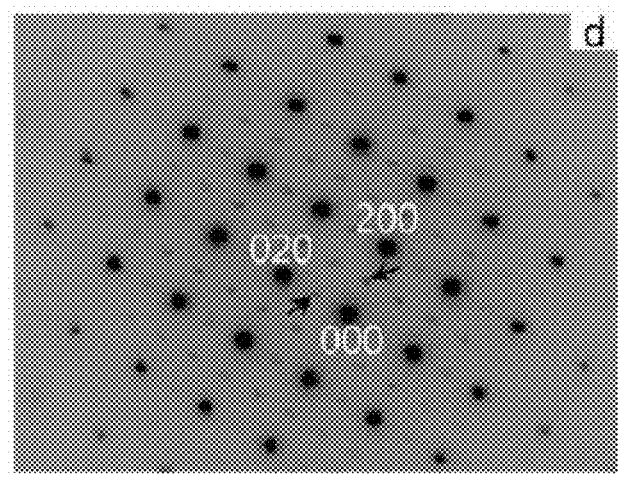
FIG. 11d is an image illustrating the selective area diffraction pattern (SADP) of a polydomain matrix.

FIGS. 11a to 11c illustrate the TEM images of the domain boundaries of the zirconia single crystal according to an embodiment of the present invention, and FIG. 11d illustrates the diffraction pattern image of the zirconia single crystal. The upper left portions of the images of FIGS. 11a and 11b are the domain matrix area, and the lower right portions thereof are the domain boundary (DB) area. Also, the upper right portion of FIG. 11c is the domain matrix area, and the thickness of the DB area is measured to be about 15 to 20 nm.

The lattice fringe of the matrix and the DB area parallel thereto are observed in the above drawings. However, individual areas have different fringe intervals. As seen in FIG. 11a, the domain boundary was composed of parallel superlattice-type fringes, and the widths of the fringes were about 0.274 nm and 0.518 nm for the domain matrix and the parallel superlattice (domain boundary area), respectively. As seen in FIGS. 11b and 11c, however, perpendicular superlattice-type fringes were observed together with the parallel superlattice-type fringes. The perpendicular superlattice-type fringes are marked with white arrows.

As shown in FIG. 11b, the widths of the fringes were about 0.262 nm, and 0.529 nm for the domain matrix and the perpendicular superlattice-type fringes, respectively. Since the domain boundaries are coherent, it is difficult to achieve the nucleation of the monoclinic phase. Therefore, high strength and fracture toughness of single crystals can be attained through the ferroelastic transformation of the tetragonal polydomains when approximately 3 mol % $Y_2O_3$ is added to $ZrO_2$.

In t'-$ZrO_2$ with a $Y_2O_3$ content of 3 mol %, its tetragonality was very small at about half the value of pure $ZrO_2$ with a c/a ratio of 1.013 to 1.02. Therefore, from a macroscopic point of view, the crystal structure of the t'-$ZrO_2$ phase was regarded as a pseudocubic structure. However, even though it has a small c/a ratio, tetragonality determines the mutual orientation of the c-axes of the twined domains. Since domains share their boundaries coherently, a large amount of mechanical stress might have been accumulated at the domain boundaries, which may have resulted in the compression and expansion of the lattices. Therefore, the nearly doubled lattice widths in the superlattice-type fringes near the domain boundary area observed in FIGS. 11a to 11c might have been caused due to the mechanical stress between the adjacent domains as the domain configuration changes with different tetragonal axes.

FIG. 11d is the selective area diffraction pattern (SADP) of the matrix composed of polydomains. The analysis of dark spots in the reciprocal lattice showed that the axial length from the origin to respective 200 and 020 was identical, and the angular relationship between $|g_a|$ and $|g_b|$ formed a 90° angle, which supports the observation that the matrix had a pseudocubic structure. However, weak diffraction spots were also observed in the middle of clear spots. Since the half-distance of vectors between diffraction spots in the reciprocal plane corresponded to the double-distance in real plane, the parallel and perpendicular superlattice-type fringes observed near the domain boundary area may be attributed to the generation of weak diffraction spots in FIG. 11d.

Figure 12A:
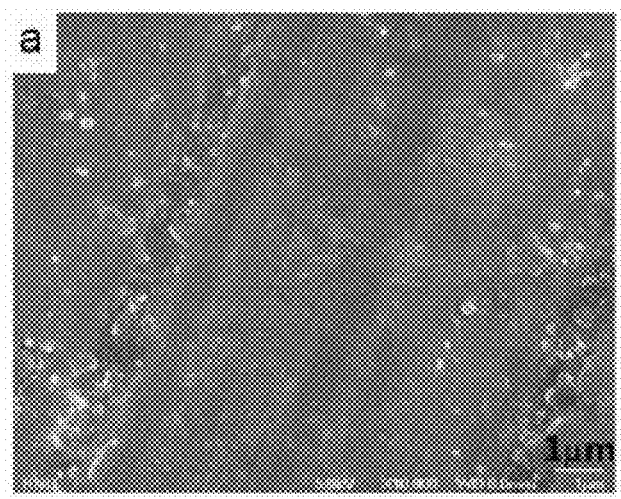
FIGS. 12a to 12d are SEM images illustrating a zirconia single crystal (t'-YSZ) according to an embodiment of the present invention and a conventional sintered zirconia polycrystal (3Y-TZP), FIG. 12a showing the surface image of the zirconia single crystal (t'-YSZ) according to the present invention, FIG. 12b showing the surface image of the conventional sintered zirconia polycrystal (3Y-TZP), FIG. 12c showing the surface image of the zirconia single crystal (t'-YSZ) according to the present invention after autoclave treatment, and FIG. 12d showing the surface image of the conventional sintered zirconia polycrystal (3Y-TZP) after autoclave treatment.
Figure 12B:
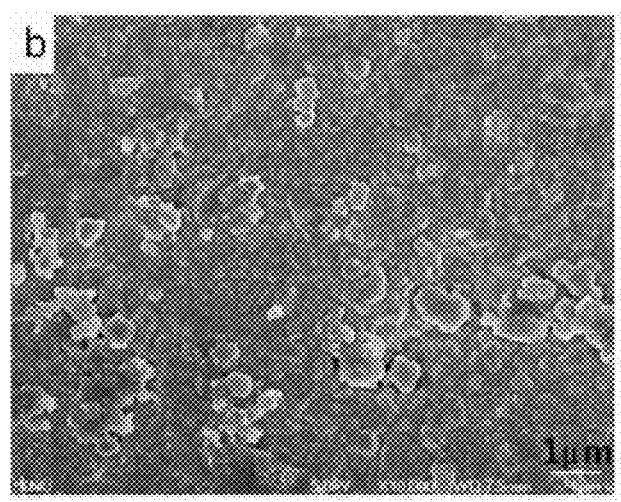
Figure 12C:
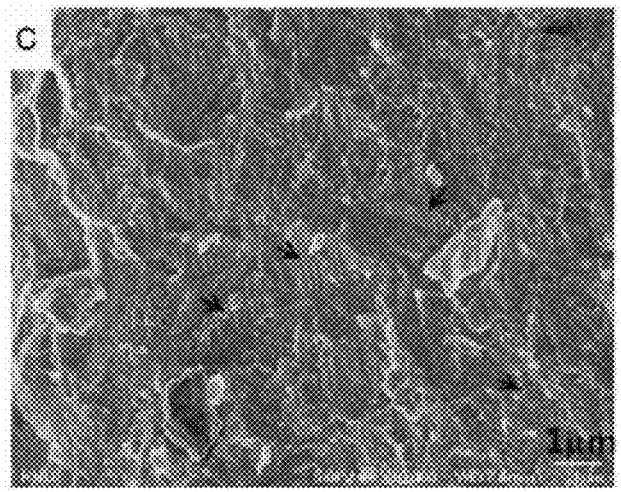
Figure 12D:
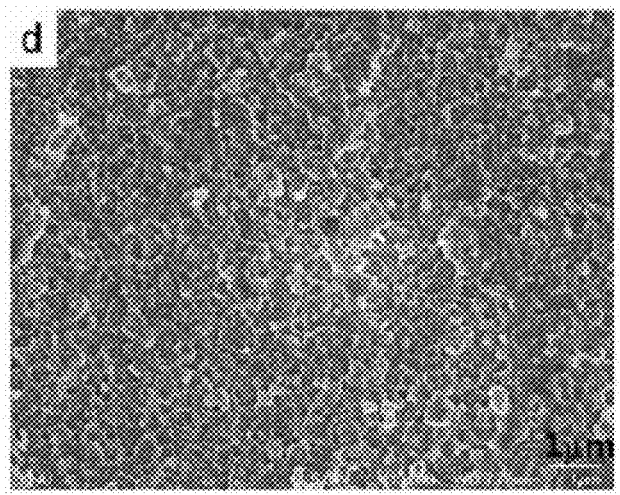

FIGS. 12a to 12d show the SEM images of the t'-$ZrO_2$ single crystal and the polycrystalline specimen. FIGS. 12a and 12b are the respective surfaces of the single crystal and the polycrystalline specimen after autoclave treatment. FIGS. 12c and 12d are the fracture surfaces of the single crystal and the polycrystalline specimen after autoclave treatment, respectively. In FIG. 12a, The surface of the single crystal was relatively clean and some scratches formed by the machining process could be seen. Concerning the fracture surfaces of the single crystal (FIGS. 9 and 12c), there were no great differences in the fracture images of the single crystals regardless of the autoclave treatment, i.e., the Herringbone domain structures were still maintained (FIG. 12c). In case of FIG. 12b, some bumpy large grains were observed.

Although the preferred embodiments of the present invention have been disclosed for illustrative purposes, those skilled in the art will appreciate that various modifications, additions and substitutions are possible, without departing from the range that does not fall out of the essential characteristics of the present invention. Thus, the embodiments disclosed in the present invention explain and are not construed as limiting the spirit of the present invention, and the scope of the spirit of the present invention is not confined by such embodiments. The scope of the present invention has to be interpreted based on the following claims, and all the technical ideas within the range equivalent thereto should be understood to be incorporated into the scope of the present invention.

DESCRIPTION OF THE REFERENCE NUMERALS IN THE DRAWINGS

| | |
|---|---|
| 10: skull crucible | 20: induction coil |
| 30: cooling unit | 40: elevation unit |
| 50: sintered layer | 60: melting line |
| 70: melting seed | 80: raw material |
| 82: raw material seed | 84: raw material other than raw material seed |
| 90: seed | 100: single crystal |
| 110: herringbone domain boundary | |
| 120: domain | 130: ferroelastic stress |
| 140: external stress due to phase transformation | |
| 150: transformed stress | 160: crust layer |

The invention claimed is:

1. A zirconia single crystal free from low temperature degradation, manufactured from a raw material comprising 93 to 95 wt % of $ZrO_2$, 5 to 7 wt % of $Y_2O_3$, and inevitable impurities and grown by a skull melting process using a high-frequency induction heating device, wherein a raw material seed having a size of 10 to 30 μm is selected from the raw material to produce a seed for growing the zirconia single crystal for at least 3 hours, and the raw material, which is melted, is subjected to soaking, in which an output power of the high-frequency induction heating device is maintained constant for at least 10 hours, and an induction coil of the high-frequency induction heating device is elevated at an elevation rate of 2 mm/hour or less to produce the seed,
wherein the zirconia single crystal has a pseudocubic structure with a tetragonality ratio c/a of 1.013 to 1.02;
the zirconia single crystal has a twinned structure with a regular herringbone shape; and
the zirconia single crystal is free from low temperature degradation.

2. The zirconia single crystal of claim 1, wherein the zirconia single crystal has a domain having a width of hundreds of nm and a length of 1 to 2 μm, and a domain boundary having a thickness of 15 to 20 μm.

3. The zirconia single crystal of claim 1, wherein the zirconia single crystal shows a translucent milky color due to light diffraction at a domain boundary formed by a twinned tetragonal structure (t'-phase) in the crystal.

4. The zirconia single crystal of claim 1, wherein the zirconia single crystal consists of zirconia single crystal with only a tetragonality ratio c/a of 1.013 to 1.02.

5. A zirconia single crystal produced by a process comprising:
(a) preparing a mixture of $ZrO_2$ and $Y_2O_3$ comprising 93 to 95 wt % of $ZrO_2$, 5 to 7 wt % of $Y_2O_3$ as a raw material for growing the zirconia single crystal;
(b) charging the raw material and a melting seed in a skull crucible having a diameter of 20 to 50 cm for growing the zirconia single crystal using a high-frequency induction heating device;
(c) supplying power to the high-frequency induction heating device to melt the raw material charged in the skull crucible;
(d) maintaining an output power of the high-frequency induction heating device at a predetermined magnitude for at least 10 hours in order to soak the melted raw material;
(e) elevating an induction coil of the high-frequency induction heating device at an elevation rate of 2 mm/hr or less, thus producing a seed;
(f) elevating the induction coil of the high-frequency induction heating device at an elevation rate of 1 to 20 mm/hr, thus growing a single crystal; and
(g) cutting off power to the high-frequency induction heating device when completing growth of the zirconia single crystal in the skull crucible, and cooling the zirconia single crystal grown in the skull crucible while allowing the zirconia single crystal to stand in the skull crucible,
wherein the zirconia single crystal has a pseudocubic structure with a tetragonality ratio c/a of 1.013 to 1.02;
the zirconia single crystal has a twinned structure with a regular herringbone shape; and
the zirconia single crystal is free from low temperature degradation.

6. The zirconia single crystal of claim 5, wherein the zirconia single crystal consists of zirconia single crystal with only a tetragonality ratio c/a of 1.013 to 1.02.

7. The zirconia single crystal of claim 5, wherein the step of (c) is performed under the condition that the induction coil of the high-frequency induction heating device is elevated by a predetermined height from a bottom of the skull crucible.

8. The zirconia single crystal of claim 5, wherein, in the step of (c), an output power of the high-frequency induction heating device for the raw material melting is 45 kW, the output power is gradually increased for 10 min, and when the output power of the high-frequency induction heating device reaches 45 kW, it is maintained for 50 min;
the step of (d) is performed for 10 hours; and
In the step of (e), the induction coil is elevated by a total of 3 mm for 3 hours at an elevation rate of 1 mm/hr.

* * * * *